(12) United States Patent
Kienzle et al.

(10) Patent No.: US 10,336,655 B2
(45) Date of Patent: Jul. 2, 2019

(54) PROCESS FOR PRODUCING SHAPED BODIES OF CARBON FIBER REINFORCED CARBON

(71) Applicant: SGL CARBON SE, Wiesbaden (DE)

(72) Inventors: Andreas Kienzle, Moettingen/Balgheim (DE); Ingrid Kraetschmer, Biberbach (DE)

(73) Assignee: SGL Carbon SE, Wiesbaden (DE)

( * ) Notice: Subject to any disclaimer, the term of this patent is extended or adjusted under 35 U.S.C. 154(b) by 302 days.

(21) Appl. No.: 15/278,056

(22) Filed: Sep. 28, 2016

(65) Prior Publication Data
US 2017/0015594 A1    Jan. 19, 2017

Related U.S. Application Data

(62) Division of application No. 11/786,277, filed on Apr. 11, 2007.

(30) Foreign Application Priority Data

Apr. 11, 2006  (EP) .................................... 06007572

(51) Int. Cl.
| C04B 35/00 | (2006.01) |
| C04B 35/83 | (2006.01) |
| F16D 69/02 | (2006.01) |
| C04B 35/64 | (2006.01) |
| C23C 16/04 | (2006.01) |
| C23C 16/26 | (2006.01) |

(52) U.S. Cl.
CPC .............. *C04B 35/83* (2013.01); *C04B 35/64* (2013.01); *C23C 16/045* (2013.01); *C23C 16/26* (2013.01); *F16D 69/023* (2013.01); *C04B 2235/3813* (2013.01); *C04B 2235/3826* (2013.01); *C04B 2235/3839* (2013.01); *C04B 2235/422* (2013.01); *C04B 2235/48* (2013.01); *C04B 2235/5248* (2013.01); *C04B 2235/5268* (2013.01); *C04B 2235/602* (2013.01); *C04B 2235/614* (2013.01); *C04B 2235/77* (2013.01); *Y10T 156/1052* (2015.01); *Y10T 428/268* (2015.01)

(58) Field of Classification Search
CPC ...................................................... C04B 35/83
See application file for complete search history.

(56) References Cited

U.S. PATENT DOCUMENTS

| 4,026,998 A | 5/1977 | Jorro et al. |
| 4,297,307 A * | 10/1981 | Taylor ..................... C04B 35/83 |
| | | 156/169 |

(Continued)

FOREIGN PATENT DOCUMENTS

EP         1514858 A2    3/2005

*Primary Examiner* — Robert A Vetere
(74) *Attorney, Agent, or Firm* — Laurence A. Greenberg; Werner H. Stemer; Ralph E. Locher

(57) ABSTRACT

A process is provided for producing shaped bodies including carbon fiber reinforced carbon in which the fibers are present in the form of bundles having a defined length, width and thickness. The defined configuration of the fibers in the bundles allows a targeted configuration of the reinforcing fibers in the carbon matrix and thus a structure of the reinforcement which matches the stress of shaped bodies including carbon fiber reinforced carbon, for example brake disks.

18 Claims, 3 Drawing Sheets

(56) References Cited

U.S. PATENT DOCUMENTS

| | | |
|---|---|---|
| 5,242,746 A | 9/1993 | Bommier |
| 5,437,821 A * | 8/1995 | Diberardino ............ C04B 35/83 |
| | | 264/29.1 |
| 5,744,075 A | 4/1998 | Klett et al. |
| 6,691,393 B2 | 2/2004 | James et al. |
| 6,802,403 B2 * | 10/2004 | Goller ..................... F16D 65/12 |
| | | 188/218 XL |
| 2003/0141153 A1 * | 7/2003 | Goller ................... C04B 35/573 |
| | | 188/218 XL |

* cited by examiner

Detail „X"

Detail „X"

PROCESS FOR PRODUCING SHAPED BODIES OF CARBON FIBER REINFORCED CARBON

CROSS-REFERENCE TO RELATED APPLICATION

This is a Divisional Application of U.S. application Ser. No. 11/786,277, filed Apr. 11, 2007, this application also claims the priority, under 35 U.S.C. § 119, of European Application EP 06 007 572.8, filed Apr. 11, 2006; the prior application is herewith incorporated by reference in its entirety.

BACKGROUND OF THE INVENTION

Field of the Invention

The present invention relates to a process for producing shaped bodies, e.g. brake disks, of carbon reinforced with short carbon fibers.

Composites including a carbon matrix reinforced with carbon fibers (CFRC materials), which are also referred to as carbon/carbon materials (C/C materials), have a high mechanical strength and heat resistance. Those materials are therefore, inter alia, suitable materials for high-performance brakes, e.g. for aircraft or in racing.

The reinforcing carbon fibers are often present in the form of flat or three-dimensional textiles, for example as woven fabrics or needled preforms. However, both variants are relatively expensive to produce and can only be fitted to complex geometries to a limited extent.

An alternative is to make up the fiber reinforcement from loose short fibers or/and short fiber bundles.

U.S. Pat. No. 5,242,746 discloses a friction element which includes carbon fiber reinforced carbon and is composed of a plurality of different functional layers. The friction element includes at least one structural layer which typically has a thickness of from 10 to 20 mm and has a high mechanical strength and at least one friction layer which typically has a thickness of from 3 to 7 mm and has advantageous tribological properties and a high abrasion resistance.

The fiber reinforcement of the structural layer has a relatively coarse texture and is formed by bundle-like segments of rovings. The segments have a mean length of from 5 to 60 mm and include from 1,000 to 320,000 virtually parallel individual filaments. The rovings, which are cut to form bundles, can be pre-impregnated to avoid disintegration of the bundles.

The fiber reinforcement of the friction layer has a fine texture and is formed by broken up individual filaments or bundles of less than 100 individual filaments having a mean length of from 0.05 to 60 mm, preferably from 0.2 to 2 mm.

The fiber bundles in the structural layer are randomly distributed, like the individual fibers in the friction layer. There is a continuous transition in the texture of the fiber reinforcement and of the carbon matrix between the two layers, so that the layers form a one-piece component.

If the fiber bundles are produced, as proposed in U.S. Pat. No. 5,242,746, by cutting of rovings, the disintegration of the bundles can be reduced by pre-impregnation of the rovings, but the bundles obtained in that way are defined only by the mean length and the number of individual filaments, i.e. they do not have a defined width (dimension perpendicular to the longitudinal extension of the fibers, dependent on the number of fibers located side by side to one another) and thickness (dimension perpendicular to the length and width, dependent on the number of fibers located above one another) which can be set in a predetermined manner. That is because the individual filaments in the rovings can be both disposed side by side to one another and above one another and their configuration depends greatly on the external conditions (pressure, tension, shear force during mixing, etc.) to which the roving or the segments cut therefrom are subjected until the impregnation has cured sufficiently for it to fix the filaments in their configuration present at that point in time.

SUMMARY OF THE INVENTION

It is accordingly an object of the invention to provide a process for producing shaped bodies having a carbon matrix reinforced with carbon fibers (C/C shaped bodies), which overcomes the hereinafore-mentioned disadvantages of the heretofore-known processes of this general type, and which makes it possible for the reinforcement to be formed of fiber bundles having defined dimensions, with a cohesion and parallel spatial configuration of the fibers in the bundles being retained upon mixing into a molding composition. The defined configuration of the fibers in the bundles allows a targeted configuration of the reinforcing fibers in the carbon matrix and thus a structure of the reinforcement which matches the stress.

With the foregoing and other objects in view there is provided, in accordance with the invention, a process for producing shaped bodies, especially brake disks, including a carbon matrix reinforced with short carbon fiber bundles. The process comprises the following steps:

production or provision of bundles of parallel carbon fibers held together by a dimensionally stable cured, carbonizable binder, with the bundles having a specifically set, defined length, width and thickness, production of a molding composition by mixing of the fiber bundles, a carbonizable matrix former and optional auxiliaries, production of a green body which is close to the final shape by pressing of the molding composition in a mold which is close to the final shape at elevated temperature with curing of the carbonizable matrix former, and subsequent demolding, carbonization of the green body to form a carbonized shaped body, mechanical re-working of the carbonized shaped body, if necessary, optional re-impregnation of the carbonized shaped body with a carbonizable matrix former and carbonization, and densification of the carbonized shaped body by deposition of a carbon matrix through the use of a CVI process.

With the objects of the invention in view, there is also provided a second process variant of the invention. The second process comprises the following steps:

production or provision of bundles of parallel carbon fibers held together by a carbonized binder, with the bundles having a specifically set, defined length, width and thickness, impregnation of the fiber bundles with a carbonizable matrix former in a mechanically generated fluidized bed, production of a molding composition by mixing of the impregnated fiber bundles, a carbonizable matrix former and optional auxiliaries, production of a green body which is close to the final shape by pressing of the molding composition in a mold which is close to the final shape at elevated temperature with curing of the carbonizable matrix former, and subsequent demolding, carbonization of the green body to form a carbonized shaped body, mechanical re-working of the carbonized shaped body, if necessary, optional re-impregnation of the carbonized shaped body with a carbonizable matrix former and carbonization, and densification of the carbonized shaped body by deposition of a carbon matrix through the use of a CVI process.

In this process variant, the fiber bundles are densified by impregnation in a fluidized bed. The green body including the molding composition having impregnated fiber bundles and the carbonized shaped body obtained therefrom are therefore more highly densified than in the first process variant. The time required for densification of the carbonized shaped body through the use of CVI is therefore lower in the second process variant.

With the objects of the invention in view, there is also provided a shaped body, comprising carbon reinforced with carbon fiber bundles and a carbon matrix including a pyrolysis residue of a carbonizable matrix former and carbon deposited by chemical vapor infiltration (CVI). The carbon fiber bundles have specifically set, defined dimensions, with a thickness of the bundles being set to a value in a range of from 0.15 to 0.4 mm, a length of the bundles being set to a value in a range of from 6 to 15 mm, and a width of the bundles being set to a value in a range of from 0.5 to 3.5 mm, and the carbon fiber bundles having carbon fibers aligned parallel to one another.

Other features which are considered as characteristic for the invention are set forth in the appended claims.

Although the invention is illustrated and described herein as embodied in a process for producing shaped bodies of carbon fiber reinforced carbon, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
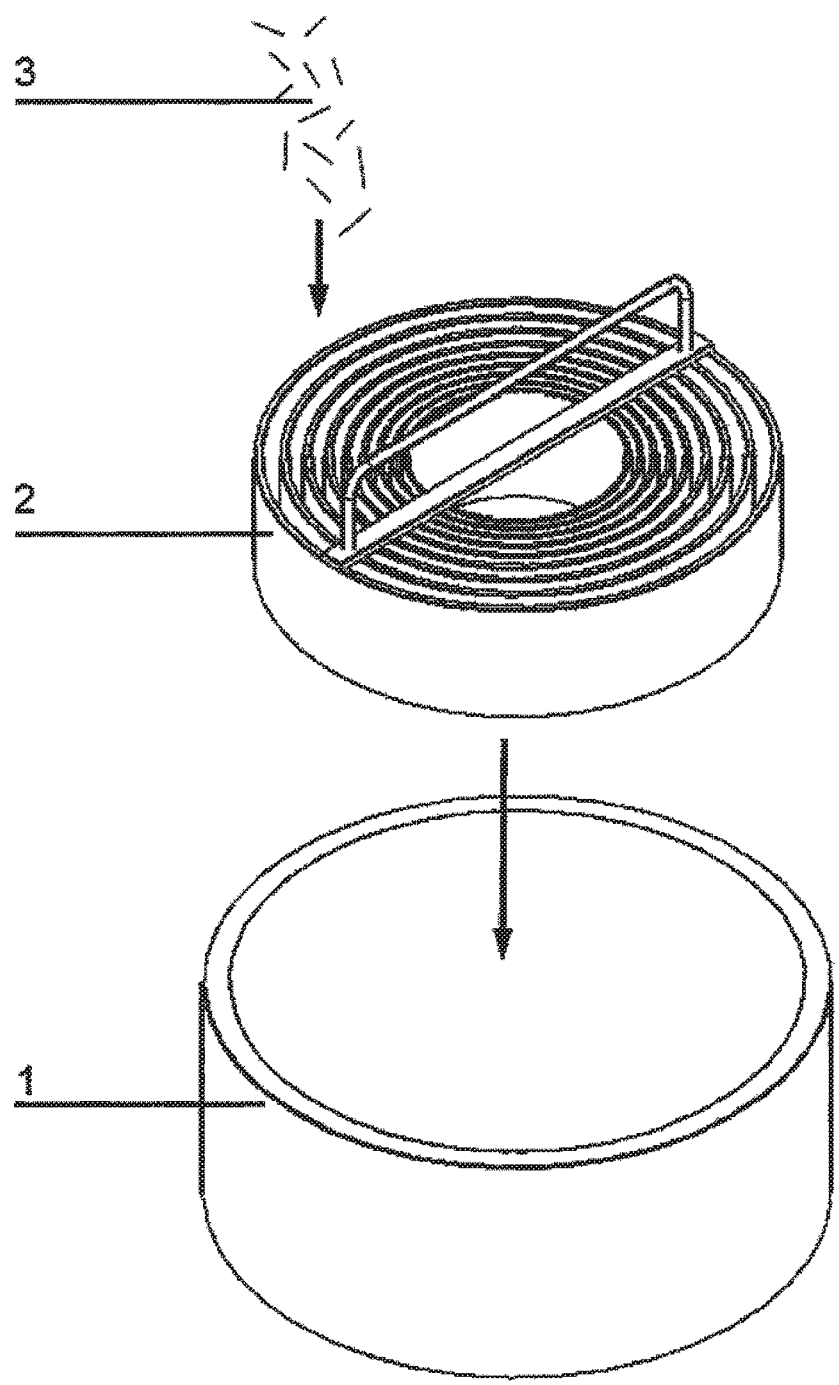
FIG. 1 is a diagrammatic, perspective view illustrating charging of a tool for producing a brake disk having tangential alignment of fiber bundles.

For the purposes of the present invention, carbon fibers are all types of carbon fibers regardless of the starting material, but with polyacrylonitrile, pitch and cellulose fibers being the most widely used starting materials.

A process for producing fiber bundles which have a defined length, width and thickness and include parallel carbon fibers and a dimensionally stable cured polymeric binder is disclosed in European Patent Application EP 1 645 671, corresponding to U.S. Patent Application Publication No. US 2006/0076699. In a variant adapted for the present invention, that process includes the following steps:

impregnation of at least one roving, including a plurality of parallel carbon fiber filaments, with a carbonizable binder so as to yield a prepreg, pressing of at least one impregnated roving or a plurality of parallel impregnated rovings to form a laminate sheet including parallel filaments (unidirectional laminate, hereinafter referred to as UD laminate) and having a defined thickness, combined with curing of the binder by heat treatment so as to yield a dimensionally stable laminate sheet of defined thickness, and cutting of the UD laminate sheet, which may have been separated into individual bands, to yield segments (fiber bundles) of defined width and length.

The rovings are preferably fanned out before impregnation in order to aid in the parallel configuration of the fibers next to one another in the plane.

The binder content of the prepreg is from 25 to 48% by mass and depends on the impregnation conditions selected. The prepreg has a mass per unit area of from 200 to 500 $g/m^2$.

The prepreg in the form of one or more impregnated rovings disposed side by side is passed through rollers, a calender, a belt press or another suitable continuous pressing apparatus. In this pressing apparatus, the excess binder is preferably squeezed out of the rovings through the use of a plurality of gaps between rollers which are disposed in series with decreasing gap width and the rovings are pressed flat to such an extent that each roving includes no more than three superposed layers of fibers, preferably only one single layer of fibers, having substantially parallel filaments. The pressing of the prepreg is carried out in the hot state (a temperature up to 200° C.), so that the carbonizable binder either cures fully or cures to at least such an extent that dimensionally stable rovings in which the individual filaments are fixed in their parallel configuration next to and above one another, are obtained.

Cooling of the now flat rovings bonded by the cured binder is also preferably carried out in the pressing apparatus. After leaving the continuous pressing apparatus, a flat laminate sheet including parallel filaments (unidirectional laminate, hereinafter referred to as "UD laminate") and having a thickness of from 0.15 to 0.4 mm is obtained. The laminate sheet can, if necessary to assist handling, be divided up into bands having a width of from 20 to 60 mm.

The UD laminate sheets or bands are then cut longitudinally into strips having a width which corresponds to the desired width of the fiber bundles. This is preferably effected through the use of a cutting roller or a plurality of cutting rollers disposed side by side. It is also possible to cut the laminate sheet or the bands in the not yet fully cured state into strips through the use of wires stretched across the path of the band.

The strips are fed directly to a preferably continuously operated apparatus for cutting to length and cut into segments (fiber bundles) of the desired length. However, it is also possible to carry out the cutting to length in a process which is separate from the cutting of the strips and operates at a different speed. For this purpose, the strips which have been cut to the chosen width are wound up onto spools and transported to the apparatus for cutting to length. The continuous cutting of the strips to the desired length is preferably carried out through the use of a blade roller.

The fiber bundles obtained in this way have a defined, uniform length, width and thickness. The bundle thickness, i.e. the number of superposed layers of fibers, was set during pressing of the roving to form the laminate sheet. The bundle width, i.e. the dimension which is perpendicular to the fiber direction and is determined by the number of parallel fibers disposed side by side to one another in a layer of fibers, is set in the longitudinal cutting of the laminate sheet or the bands to yield strips. The bundle length, i.e. the dimension in the fiber direction, is set by the cutting to length of the strips to yield segments (fiber bundles).

At least 90% of the fiber bundles produced in this way have a length which is in the range of from 90 to 110% of the mean length and a width which is in the range of from 90 to 110% of the mean width.

The fiber bundles obtained in this way are very easy to handle, they are free-flowing and can be poured and can easily be mixed with other components to yield relatively homogeneous molding compositions. Within the bundles, the fibers are held together by the dimensionally stable cured binder, so that the bundles cannot disintegrate during further processing and the fibers are fixed in their parallel spatial configuration within the bundles.

Fiber bundles having a thickness of from 0.15 to 0.4 mm, a length of from 6 to 15 mm and a width of from 0.5 to 3.5 mm are particularly suitable for the process of the present invention. Fine fiber bundles, i.e. fiber bundles having a low thickness (preferably only one layer of fibers) and a low width (not more than 1 mm) are preferred since a particularly homogeneous distribution of the fibers in the molding composition and thus a fairly uniform density of the molding composition and a particularly homogeneous microstructure of the shaped body can be achieved therewith. The more homogeneous the microstructure of the shaped body, the fewer the opportunities for failure under load.

The fiber bundles are mixed with a carbonizable matrix former and, if appropriate, auxiliaries, to yield a molding composition.

For the purposes of the present invention, a carbonizable matrix former is a carbon-containing polymeric material, for example a resin, which upon heating in a nonoxidizing atmosphere forms a pyrolysis residue consisting essentially of carbon. The carbonizable matrix former can be present as a pulverulent dry resin or as a wet resin. Phenolic resins are particularly suitable as matrix formers. The proportion by mass of the fiber bundles in the molding composition is from 70 to 80%. If a dry resin is used as a matrix former, mixing can be carried out in a tumble mixer. When a wet resin is used, more intensive mixing is necessary, which can be achieved, for example, through the use of an Eirich mixer.

Due to the dimensionally stable cured binder in the fiber bundles which holds the parallel fibers together, the fiber bundles do not break up during mixing with the matrix former. This ensures that the fiber bundles have a largely uniform defined length, width and thickness in the molding composition. If required, auxiliaries such as silicon carbide for improving the tribological properties and oxidation inhibitors such as zirconium carbide, tantalum carbide or tantalum boride which inhibit oxidative attack upon exposure to oxygen by glass formation, can be mixed into the molding composition. The total proportion by mass of auxiliaries in the molding composition is not more than 10%.

In an advantageous embodiment of the process of the invention, the carbonizable binder present in the fiber bundles is firstly carbonized before production of the molding composition or, as an alternative, the binder in the UD laminate is carbonized before cutting of the bundles. The bundles obtained in this way include parallel carbon fibers held together with a carbonized binder. Due to the volume shrinkage of the binder occurring upon carbonization, these bundles are relatively open-pored and can therefore directly take up further carbonizable matrix former. For the purposes of the present invention, a carbonizable matrix former is a carbon-containing polymeric material, for example a phenolic resin, which upon heating in a nonoxidizing atmosphere forms a pyrolysis residue consisting essentially of carbon.

In order to prevent the impregnated fiber bundles from sticking together as a result of the resin adhering to their surfaces, impregnation is advantageously carried out in a mechanically generated fluidized bed. This can be generated through the use of a blade mixer. In this case, the carbon fiber bundles are firstly preheated to a temperature sufficient for curing or drying of the resin while mixing at a Froude number of less than 1. The resin is subsequently introduced while briefly increasing the Froude number to values in the range of from 1.5 to 4, preferably not more than 2.5, and after the resin has been mixed into the fluidized bed is maintained at a Froude number of less than 1 until the resin has cured or dried completely so that the bundles can no longer stick together.

In this impregnation, the bundles including parallel carbon fibers held together by a carbonized binder can take up up to 35% of their own mass of carbonizable matrix former.

Further details of the impregnation process may be found in European Patent Application EP 06 007 562.9, filed Apr. 11, 2006, corresponding to U.S. Patent Application No. entitled Process for the Impregnation of Carbon Fiber Bundles, Resin-Impregnated Carbon Fiber Bundle, Shaped Body and Intermediate Body for Silicization, filed on the same day as the instant application and assigned to the same assignee as the instant application.

A molding composition is produced in the above-described way from the impregnated fiber bundles, a carbonizable matrix former and, if appropriate, auxiliaries.

A green body having the desired shape, for example in the form of a brake disk, is produced from the molding composition through the use of a mold which is close to the final shape. Pressing is typically carried out at a pressure in the range of from 1.5 to 5 N/mm$^2$ and a temperature in the range of from 120 to 200° C. Preference is given to using a hot molding press. After curing, the tool is opened and the green body which is close to the final shape is taken out.

In the next step, the carbonizable matrix former in the green body is converted into a carbon matrix so as to yield a carbonized shaped body. For this purpose, the green body is heated slowly in a protective gas atmosphere, i.e. under nonoxidizing conditions, to a temperature at which pyrolysis of the matrix former to yield a residue consisting essentially of carbon occurs and is maintained at this temperature for a particular time. Heating has to be carried out sufficiently slowly to avoid formation of cracks in the shaped body due to sudden release of gaseous pyrolysis products. Heating is typically carried out at a rate of 1 K/min to a temperature of 900° C., which is then maintained for about one hour. The body is subsequently slowly cooled down to room temperature again. During carbonization, the shaped body experiences a decrease in mass and correspondingly an increase in porosity as a result of the elimination of gaseous pyrolysis products from the matrix former. The density of the carbonized shaped body is typically from about 1.3 to 1.45 g/cm$^3$.

In order to compensate for the decrease in mass, the carbonized shaped body can be re-impregnated with a carbonizable matrix former (resin or pitch) and then carbonized again.

The carbonized shaped body can be subjected to further mechanical working if necessary. For example, in the case of a brake disk, cooling channels can be cut out or holes can be introduced.

However, it is also possible to carry out such shaping through the use of lost cores during production of the green body. The production of shaped bodies containing hollow spaces in a pressing process through the use of lost cores having external dimensions which correspond to those of the hollow space to be produced and are introduced into the molding composition at positions of the hollow spaces to be produced, is prior art. The cores are formed of a material which at the pressing temperature decomposes thermally leaving virtually no residue and thus leaves behind the desired hollow space.

The porous carbonized shaped body is re-densified by deposition of a carbon matrix through the use of chemical vapor infiltration (CVI), so that its density increases to values in the ranges from 1.6 to 1.8 g/cm$^3$. The deposition of carbon through the use of chemical vapor infiltration is prior art. A suitable carbon-donating gas is methane.

The time required for the re-densification through the use of CVI can be reduced by about 10-30% if the fiber bundles are impregnated with a carbonizable matrix former before being mixed into the molding composition, so as to yield a denser green body. Re-impregnation of the carbonized shaped body with a carbonizable matrix former which is subsequently carbonized, also effects a comparable shortening of the time required for CVI.

The orientation of the fiber bundles in the shaped bodies produced according to the invention can be random, i.e. statistically distributed. This is preferred when the body is subjected to an approximately uniform load in all spatial directions.

However, in the case of shaped bodies which are subject to a particular load in a particular direction, orientation of the fiber bundles according to stress is desirable. This can be achieved by simple measures during introduction of the molding composition containing the fiber bundles into the mold, for example by use of a charging grate.

In the case of brake disks, preference is given to aligning the fiber bundles in a tangential direction corresponding to the tensile stress which occurs. A charging grate which has a plurality of concentric rings is used for this purpose.

Example

A variant of the process of the invention is described below for the example of the production of a brake disk.

Production of the Fiber Bundles

Carbon fiber rovings each including 50,000 virtually parallel individual filaments are impregnated with a phenolic resin (Norsophen 1203 from the firm Hexion) so as to form a prepreg having a resin content of 35% by mass and a weight per unit area of 320 g/m$^2$.

This prepreg is continuously compacted at a speed of 1 m/min and a pressure of 1 MPa (10 bar) on a belt press at a temperature of 180° C. to form a laminate sheet having a thickness of 200 μm and is at the same time cured so as to yield a dimensionally stable laminate sheet.

The UD laminate sheet is subsequently divided into individual bands having a width of 50 mm each. These are cut as described above to yield segments (fiber bundles) having a length of 9.4 mm and a width of 1 mm.

Production of the Molding Composition 2400 g of the fiber bundles are transferred to a tumble mixer, 600 g of powder resin (phenolic resin SP 227 from the firm Hexion as a carbonizable matrix former) are poured over them, and the fiber bundles and the resin are mixed for 5 minutes.

Production of the Green Body

Figure 2:
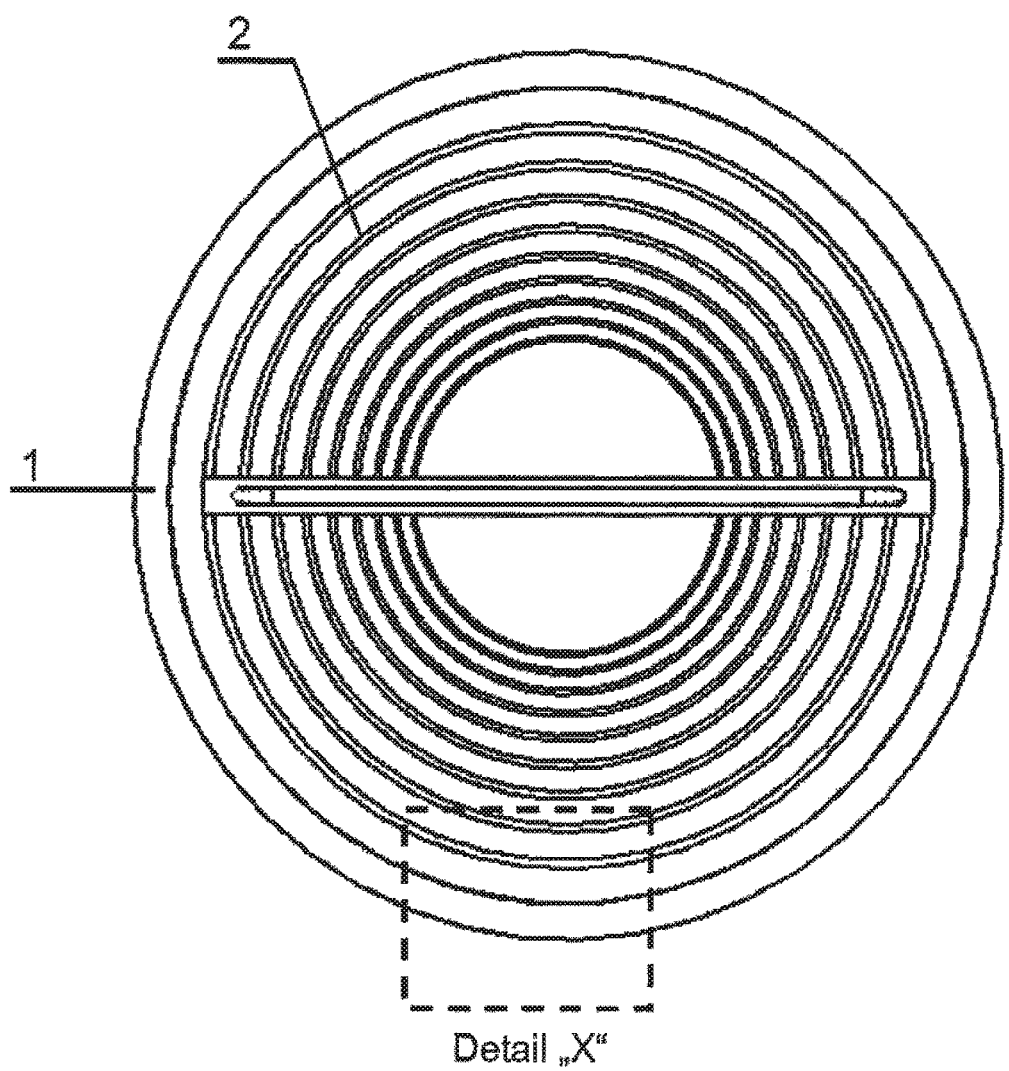
FIG. 2 is a top-plan view of the tool with a charging grate.
Figure 3:
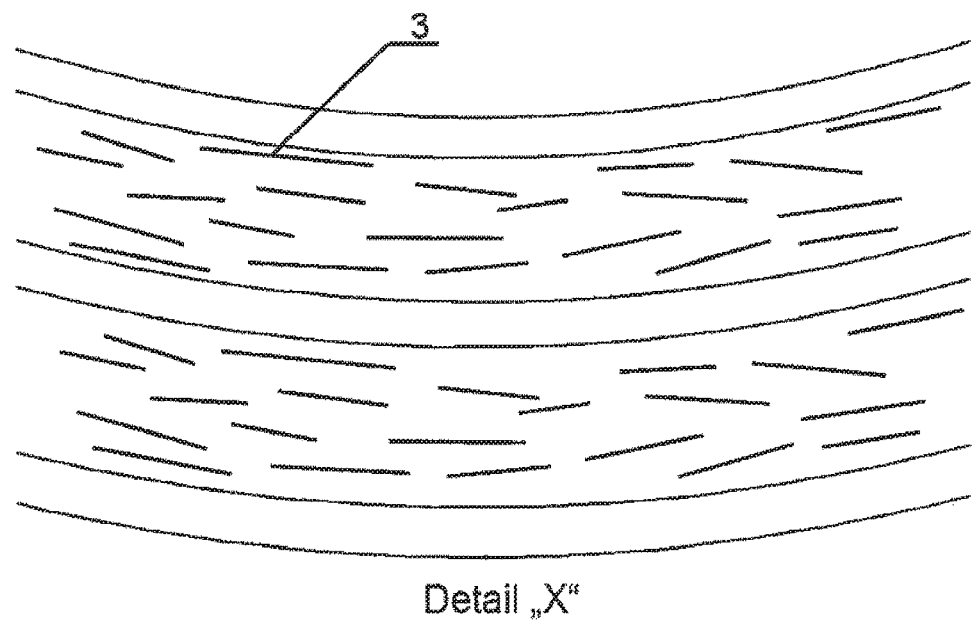
FIG. 3 is an enlarged, fragmentary, top-plan view showing a tangential configuration of the fibers in the tool brought about by the charging grate.

Referring now to the figures of the drawings in detail and first, particularly, to FIG. 1 thereof, there is seen a diagrammatic illustration of the charging of the mold. A mold 1, having a cavity which corresponds to the geometry of the brake disk to be produced, is charged with the molding composition containing the fiber bundles 3. In order to achieve a preferred tangential alignment of the fiber bundles 3, a charging grate 2 which has a plurality of concentric rings having a spacing of less than or equal to the length of the fiber bundles 3, is used. FIG. 2 diagrammatically shows how the charging grate 2 is disposed on the mold 1. During filling, the molding composition containing the fiber bundles 3 falls through the intermediate spaces between the concentric rings of the charging grate 2 and the fiber bundles 3 take on the substantially tangential configuration shown diagrammatically in FIG. 3. The charged mold is subjected to a pressure of 4.0 N/mm$^2$ and a temperature of 160° C. on a hot molding press for 30 minutes and subsequently opened. During pressing, the phenolic resin cures. A green body which is close to the final shape in the form of a brake disk is obtained.

Carbonization

The green body is heated at a heating rate of 1 K/min to a temperature of 900° C. under a nitrogen atmosphere in a protective gas furnace. In this case, the phenolic resins are decomposed to leave a residue consisting essentially of carbon. This temperature is maintained for one hour. The carbonized shaped body is then cooled to room temperature.

Re-Densification Through the Use of CVI

A carbon matrix is deposited in the porous carbonized shaped body through the use of chemical vapor infiltration (CVI). The CVI is carried out at 1100° C. using methane as a carbon donor. As a result of the deposition of carbon, the density of the carbonized shaped body increases from 1.3 to 1.8 g/cm$^3$.

Characterization of the Brake Disk

A coefficient of friction of μ=0.5 to 0.6 was determined on a pendulum test rig.

Due to the tangential orientation of the fiber bundles, the strength of the brake disks determined in a bending test increased by 12-20% as compared to brake disks having a random configuration of the fiber bundles.

The invention claimed is:

1. A process for producing shaped bodies having a carbon matrix reinforced with carbon fiber bundles, the process comprising the following steps:
   producing or providing bundles of parallel carbon fibers held together by a dimensionally stable cured, carbonizable binder, with the bundles having a specifically set, defined uniform length, width and thickness;
   producing a molding composition by mixing the fiber bundles, a carbonizable matrix former and optional auxiliaries;
   producing a green body being close to a final shape by pressing the molding composition in a mold being close to the final shape at elevated temperature with curing of the carbonizable matrix former,
   and densifying the carbonized shaped body by deposition of a carbon matrix in a chemical vapor infiltration (CVI) process.

2. The process according to claim 1, which further comprises:
carbonizing the binder in the fiber bundles produced or provided in the step of producing or providing bundles of parallel carbon fibers by impregnation; and
re-impregnating the fiber bundles with a carbonizable matrix former in a mechanically generated fluidized bed before the step of producing the molding composition.

3. The process according to claim 1, wherein the production of the fiber bundles includes the following steps:
impregnating at least one roving, including a plurality of parallel carbon fiber filaments, with a carbonizable binder to yield a prepreg;
pressing at least one impregnated roving or a plurality of parallel impregnated rovings to form a laminate sheet including parallel filaments (UD laminate) and having a defined thickness, combined with curing of the binder by heat treatment to yield a dimensionally stable laminate sheet of defined thickness; and
cutting the (UD) laminate sheet, which may have been separated into individual bands, to yield segments of fiber bundles of defined width and length.

4. The process according to claim 1, which further comprises setting a thickness of the fiber bundles to a value in a range of from 0.15 to 0.4 mm, setting a length of the fiber bundles to a value in a range of from 6 to 15 mm, and setting a width of the fiber bundles to a value in a range of from 0.5 to 3.5 mm.

5. The process according to claim 4, which further comprises setting the width of the fiber bundles at 1 mm.

6. The process according to claim 1, wherein the carbonizable matrix former is a phenolic resin.

7. The process according to claim 1, wherein a proportion by mass of the fiber bundles in the molding composition is from 70 to 80%.

8. The process according to claim 1, wherein the molding composition contains not more than 10% by mass of the auxiliaries.

9. The process according to claim 8, which further comprises providing at least one of the following auxiliaries:
tribological auxiliaries such as silicon carbide,
oxidation-inhibiting auxiliaries, such as zirconium carbide, tantalum carbide or tantalum boride.

10. The process according to claim 1, which further comprises introducing the molding composition into the mold through a charging grate causing the fiber bundles to assume an alignment determined by the charging grate.

11. The process according to claim 1, which further comprises producing the green body with a mold being close to the final shape at a pressure in a range of from 1.5 to 5 $N/mm^2$ and a temperature of from 120 to 200° C. in a hot molding press.

12. The process according to claim 1, wherein the carbonized shaped body is re-impregnated with a carbonizable matrix former and then carbonized again before the chemical vapor infiltration (CVI) process.

13. The process according to claim 12, which further comprises using a resin or pitch as the carbonizable matrix former for the re-impregnation of the carbonized shaped body.

14. The process according to claim 1, which further comprises using methane as a carbon donor in the chemical vapor infiltration (CVI) process.

15. The process according to claim 1, wherein the shaped body is a brake disk.

16. The process according to claim 15, which further comprises introducing the molding composition into the mold through a charging grate containing a plurality of concentric rings causing the fiber bundles to assume a tangential alignment.

17. The process according to claim 1 further comprising;
after the step of producing the green body being close to the final shape by pressing the molding composition in the mold being close to the final shape at elevated temperature with curing of the carbonizable matrix former;
mechanically working the green body by cutting cooling channels or holes in the green body.

18. The process according to claim 1 further comprising;
after the step of producing the green body being close to the final shape by pressing the molding composition in the mold being close to the final shape at elevated temperature with curing of the carbonizable matrix former, shaping through the use of lost cores during production of the green body.

* * * * *